(12) United States Patent
Chen

(10) Patent No.: US 9,142,590 B2
(45) Date of Patent: Sep. 22, 2015

(54) IMAGE SENSOR DEVICE AND MANUFACTURING METHOD THEREOF

(71) Applicant: Silicon Optronics, Inc., Hsinchu (TW)

(72) Inventor: Jun-Bo Chen, Hsinchu (TW)

(73) Assignee: SILICON OPTRONICS, INC., Hsinchu (TW)

(*) Notice: Subject to any disclaimer, the term of this patent is extended or adjusted under 35 U.S.C. 154(b) by 0 days.

(21) Appl. No.: 14/479,943

(22) Filed: Sep. 8, 2014

(65) Prior Publication Data
US 2015/0187836 A1 Jul. 2, 2015

(30) Foreign Application Priority Data
Jan. 2, 2014 (TW) .............................. 103100025 A

(51) Int. Cl.
*H01L 29/808* (2006.01)
*H01L 27/148* (2006.01)
*H01L 27/146* (2006.01)

(52) U.S. Cl.
CPC .... *H01L 27/14806* (2013.01); *H01L 27/14689* (2013.01)

(58) Field of Classification Search
CPC ............ H01L 21/28008; H01L 29/786; H01L 29/808; H01L 29/8086
See application file for complete search history.

(56) References Cited

U.S. PATENT DOCUMENTS

| 8,227,844 B2 * | 7/2012 | Adkisson et al. ............. 257/292 |
| 8,743,247 B2 * | 6/2014 | Adkisson et al. ............. 348/294 |
| 2006/0138581 A1 * | 6/2006 | Ladd ............................. 257/462 |
| 2008/0099807 A1 * | 5/2008 | Kim et al. ..................... 257/292 |

* cited by examiner

*Primary Examiner* — Eduardo A Rodela
(74) *Attorney, Agent, or Firm* — Muncy, Geissler, Olds & Lowe, P.C.

(57) ABSTRACT

A method for manufacturing a transfer gate transistor of an image sensor device is disclosed. The transistor includes a substrate, a gate oxide layer on the substrate and a gate electrode portion on the gate oxide layer. The gate electrode portion has a trench or an insulating layer used for accurately defining a first region and a second region in the gate electrode portion, wherein the first region has a first conductivity type, and the second region has a second conductivity type or is an undoped region.

20 Claims, 7 Drawing Sheets

IMAGE SENSOR DEVICE AND MANUFACTURING METHOD THEREOF

CROSS REFERENCE TO RELATED APPLICATIONS

This application claims the priority of Taiwan Patent Application No. 103100025 filed on Jan. 2, 2014, the entirety of which is incorporated by reference herein.

BACKGROUND OF THE INVENTION

1. Field of the Invention

The present invention relates to a semiconductor technique, and more particularly to a transfer gate transistor in an image sensor device and a method for forming the same.

2. Description of the Related Art

In the semiconductor technique, an image sensor device is used for sensing light illuminating on the semiconductor substrate. Common image sensor devices include complementary metal-oxide semiconductor image sensors (CIS) and charge-coupled devices (CCD), which can be applied to various applications such as digital cameras. These image sensors utilize a pixel array to receive light, so as to convert the images to digital data. The pixel array may include photodiodes and transistors. So far, types of the CIS include a 3-T architecture and a 4-T architecture. The 3-T architecture may include a reset transistor (RST), a source follower transistor (SF) and a row select transistor (RS). The 4-T architecture may include a transfer gate transistor (TX), a reset transistor, a source follower transistor and a row select transistor.

Until now, performance optimization between image lag and dark current from transfer gate is studying and researching. Such issues, however, could be improved if the gate of the transfer gate transistor had two of different doping regions. Refer to FIG. 1, the interface (junction) 11 between different doping regions in the conventional gate structure 10 is defined by a pattering process, and the interface 11 is thus often shifted due to subsequent processes. Therefore, the pixels in the same pixel array have different interface 11 position, respectively. Such inconsistent interface positions may result in the generation of noise.

Therefore, a novel method for accurately defining the position of the interface between different doping regions in the transfer gate transistor of the image sensor is desired, so as to solve or mitigate the aforementioned problems.

BRIEF SUMMARY OF THE INVENTION

A detailed description is given in the following embodiments with reference to the accompanying drawings. An image sensor device and a method for manufacturing the same are provided.

An exemplary embodiment of an image sensor device includes a transistor. The transistor includes a substrate. A gate oxide layer is on the substrate. A gate electrode portion is on the gate oxide layer and has a trench to define a position of a junction. The trench defines a first region and a second region within the gate electrode portion, wherein the first region has a first conductivity type, and the second region has a second conductivity type or is an undoped region.

An exemplary embodiment of a method for manufacturing an image sensor device includes providing a substrate. A transistor is formed in the substrate. The transistor has a gate electrode portion disposed on a gate oxide layer on the substrate. The gate electrode portion has a trench to define a position of a junction extending from a bottom of the trench to the substrate. The trench defines a first region and a second region within the gate electrode portion. The first region has a first conductivity type, and the second region has a second conductivity type or is an undoped region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of implementing the invention. This description is made for the purpose of illustrating the general principles of the invention and should not be taken in a limiting sense. The scope of the invention is best determined by reference to the appended claims.

Figure 1:
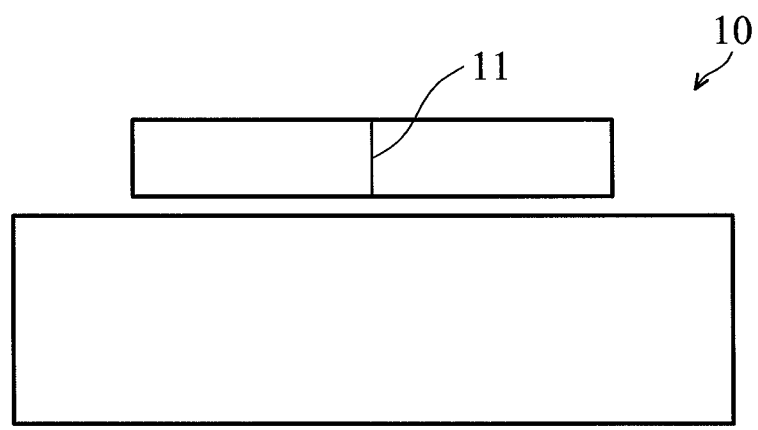
FIG. 1 is a cross-sectional view of a conventional gate structure in a transfer gate transistor of an image sensor.
Figure 2A:
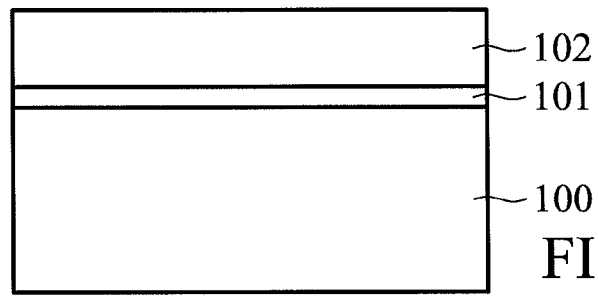
FIGS. 2A-2E are cross-sectional views of a method for manufacturing a transfer gate transistor, which has an interface between different doping regions therein, of an image sensor according to an embodiment of the invention.
Figure 2B:
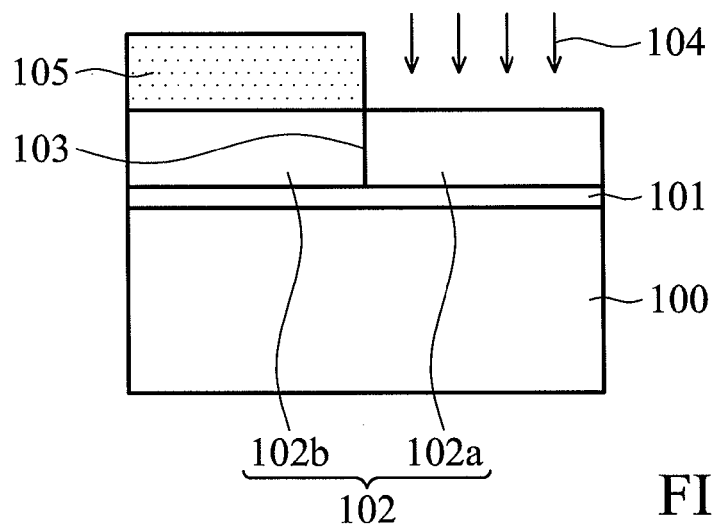
Figure 2C:
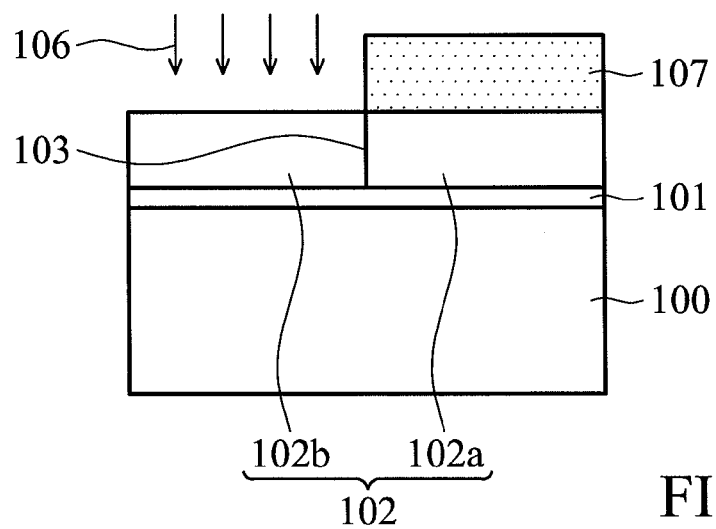
Figure 2D:
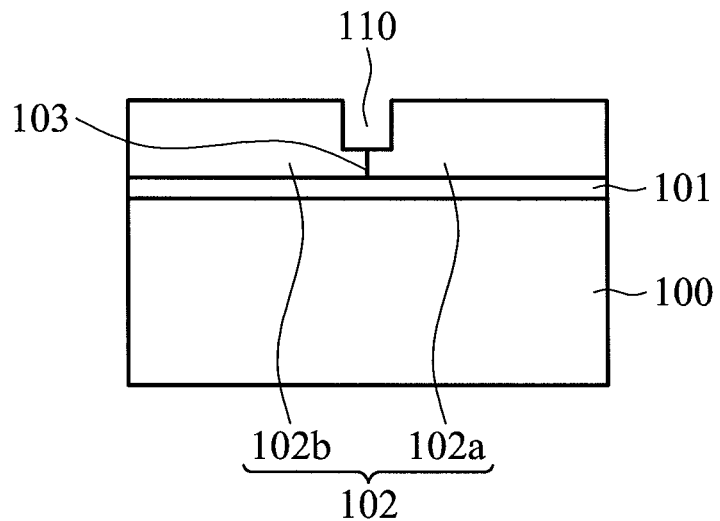
Figure 2E:
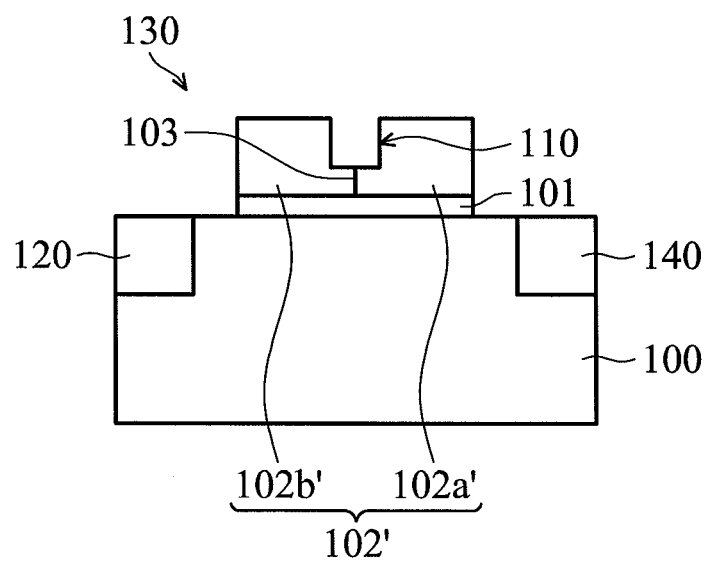

FIG. 2E is a cross-sectional view of an image sensor device according to an embodiment of the invention. Refer to FIG. 2E, in the embodiment, the image sensor device may be a CIS device including a transistor 130 (e.g., a transfer gate transistor). The transistor 130 includes a substrate 100, a gate oxide layer 101 formed on the substrate 100 and a gate electrode portion 102' formed on the gate oxide layer 101. In the embodiment, the gate electrode portion 102' has a trench 110 therein. The trench 110 defines a first region 102a' and a second region 102b' within the gate electrode portion 102'.

In an embodiment, the first region 102a' may have a first conductivity type, and the second region 102b' may have a second conductivity type different from the first conductivity type. For example, the first region 102a' is N-type, and the second region 102b' is P-type, and vise versa. In another embodiment, the first region 102a' may have a first conductivity type, and the second region 102b' may be an undoped region.

In the embodiment, the image sensor device further comprises a photodiode 120 and a floating diffusion region 140 formed in the substrate 100 on opposite sides of the gate electrode portion 102', respectively. In the embodiment, the transistor 130 (e.g., the transfer gate transistor) transfers the charges generated from the photodiode 120 to the floating diffusion region 140, but it is not limited thereto. The structure of the gate electrode portion 102' may be applied to other transistors of the image sensor device, such as the overflow gate transistor.

FIGS. 2A-2E are cross-sectional views of a method for manufacturing a transfer gate transistor, which has an interface between different doping regions therein, of an image sensor according to an embodiment of the invention. Refer to FIG. 2A, a substrate 100 is provided. In an embodiment, the substrate 100 is a semiconductor substrate, such as a silicon substrate doped with minor P-type dopants, but it is not limited thereto. In another embodiment, the substrate 100 may include other semiconductor materials, such as elementary semiconductors (e.g., silicon, germanium or diamond) or compound semiconductors (e.g., SiC, GaAs, InAs or InP). The structure of the substrate 100 may include an epitaxial layer on a bulk semiconductor, a SiGe layer on a bulk silicon, a silicon layer on a bulk SiGe or a silicon-on-insulator (SOI). The above structures are not shown in the figures for brevity and clarity. In the embodiment, the substrate 100 may include an epitaxial layer (not shown) doped with P-type or N-type dopants, but it is not limited thereto. In another embodiment, the substrate 100 may include an epitaxial layer doped with N-type dopants, and P-type dopants are doped in the region corresponding to the photodiode 120 (illustrated in FIG. 2E).

In FIG. 2A, an undoped semiconductor layer 102 is formed on the substrate 100. In addition, a gate oxide layer 101 is formed before the formation of the semiconductor layer 102. In the embodiment, the thickness of the semiconductor layer 102 is 200 nm, but it is not limited thereto. In another embodiment, the semiconductor layer 102 may have a different thickness. In the embodiment, the semiconductor layer 102 is formed of a polysilicon or a single-crystalline silicon by low pressure chemical vapor deposition (LPCVD), physical vapor deposition (PVD) using suitable silicon source materials or any suitable methods.

In FIG. 2B, a first doping process 104 (e.g., an ion implantation process) is performed on a region of the semiconductor layer 102 to form a junction 103, and a first region 102a and a second region 102b which will be defined by a trench 110 (illustrated in FIG. 2D). In the embodiment, a patterned photoresist layer 105 may be formed on the semiconductor layer 102 to act as an implant mask, thereby defining the region on which the first doping process 104 is performed. In the embodiment, the first doping process 104 may be performed using dopants of first conductivity type, such as N-type dopants (e.g., P or As) or P-type dopants (e.g., B).

In FIG. 2C, in an embodiment, a second doping process 106 (e.g., an ion implantation process) is performed on the second region 102b of the semiconductor layer 102, such that the second region 102b is doped with dopants of the second conductivity type that are opposite to the first conductivity type. For example, the first region 102a may be doped with N-type dopants, and the second region 102b may be doped with P-type dopants, or vise versa. In the embodiment, a patterned photoresist layer 107 may be formed on the first region 102a to act as an implant mask, such that the exposed second region 102b is doped with dopants of the second conductivity type.

In another embodiment, there is no doping process performed on the second region 102b. Namely, the second region 102b is an undoped region.

In the embodiment, the semiconductor layer 102 is formed as a gate electrode portion 102' (illustrated in FIG. 2E) of the transistor 130 (e.g., the transfer gate transistor) in the image sensor by subsequent steps. The gate electrode portion 102' has different doping regions of different conductivity types (i.e., the first region 102a' and the second region 102b') therein to reduce the dark current and the image lag that can occur in the image sensor device. The position of the interface (junction) 103 between the different doping regions, however, may be shifted due to thermal diffusion, which results in each of the pixels in the image sensor having a different interface (junction) position. Such inconsistent interface positions may result in the generation of noise. Refer to FIG. 2D, to solve the aforementioned problems, a trench 110 is formed on both sides of the interface 103, such that the trench 110 corresponds to the first region 102a and the second region 102b. In the embodiment, the aspect ratio of the trench is determined by the capability of the selected process. The trench 110 can be formed by any suitable method. For example, a patterned photoresist layer (not shown) is applied to the semiconductor layer 102. The region of the semiconductor layer 102 not protected by the photoresist layer is then etched to form the trench 110.

Refer to FIG. 2E, the semiconductor layer 102 is patterned to form the gate electrode portion 102' of the transistor 130 on the substrate 100. In the embodiment, the step of patterning the semiconductor layer 102 includes applying a patterned photoresist layer (not shown) on the semiconductor layer 102. Next, the regions of the semiconductor layer 102 not protected by the photoresist layer are then removed by a standard etching process to form the gate electrode portion 102'. In the embodiment, the fabrication of the transistor 130 further comprises forming other components of the transistor 130 (e.g., source/drain regions) (not shown) in the substrate 100. Such a fabrication is known to those skilled in the art and thus are not described herein.

In FIG. 2E, in the embodiment, a photodiode 120 and a floating diffusion region 140 are formed in the substrate 100 on opposite sides of the gate electrode portion 102', respectively. The fabrications of the photodiode 120 and the floating diffusion region 140 are known for those skilled in the art and thus not describe herein. Furthermore, it is appreciated that the positions of the photodiode 120 and the floating diffusion region 140 may be modified if needed, thus they are not limited to the positions illustrated in FIG. 2E. In the embodiment, the transistor 130 is a transfer gate transistor of CIS device, which transfers the charges generated from the photodiode 120 to the floating diffusion region 140, but it is not limited thereto. The structure and the fabrication of the gate electrode portion 102' can be applied to other transistors in the image sensor device, such as the overflow gate transistor.

Figure 3A:
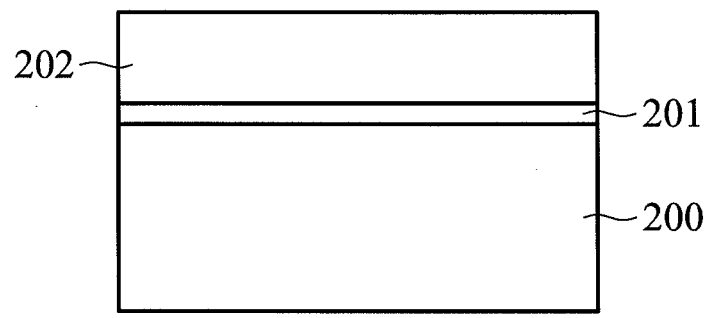
FIGS. 3A-3H are cross-sectional views of a method for manufacturing a transfer gate transistor, which has an interface between different doping regions, of an image sensor according to another embodiment of the invention.

FIGS. 3A-3H are cross-sectional views of a method for manufacturing a transfer gate transistor, which has an interface between different doping regions therein, of an image sensor according to another embodiment of the invention. Refer to FIG. 3A, a substrate 200 is provided, and a first semiconductor layer 202 is formed on the substrate 200. In addition, a gate oxide layer 201 is formed before the formation of the first semiconductor layer 202. In the embodiment, the thickness of the first semiconductor layer 202 may be 150 nm, but it is not limited thereto. In another embodiment, the first semiconductor layer 202 may have a different thickness. In the embodiment, the structure of the substrate 200 is the same as or similar to that of the substrate 100 described above. Furthermore, the material and the fabrication of the first semiconductor layer 202 is the same as or similar to those of the semiconductor layer 102, and thus are not described herein.

Figure 3B:
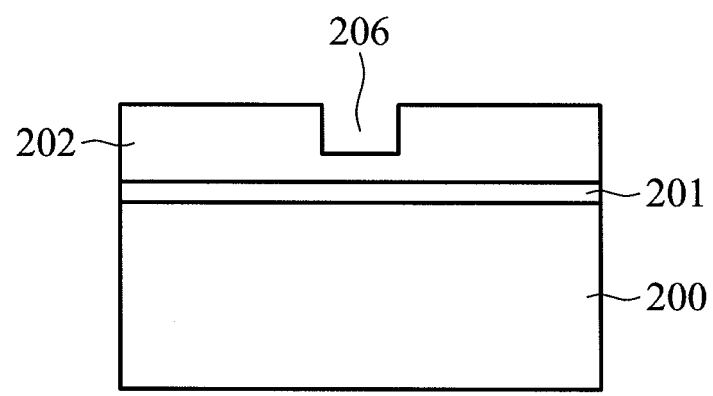

Refer to FIG. 3B, a trench 206 is formed in the first semiconductor layer 202. In the embodiment, the aspect ratio of the trench 206 is determined by the capability of the selected process. In the embodiment, the trench 206 can be formed by any suitable method. For example, a patterned photoresist layer (not shown) is formed on the first semiconductor layer 202. The region of the first semiconductor layer 202 not protected by the photoresist layer is then etched to form the trench 206.

Figure 3C:
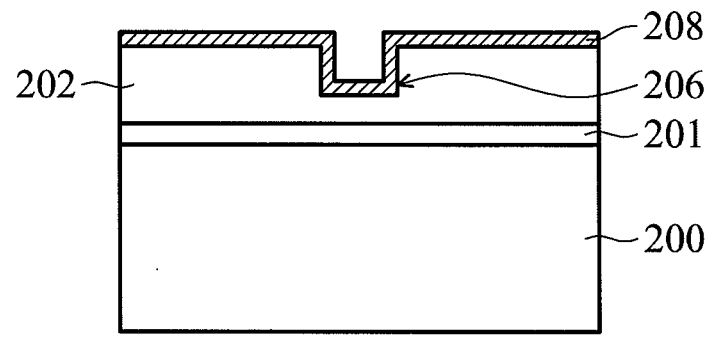
Figure 3D:
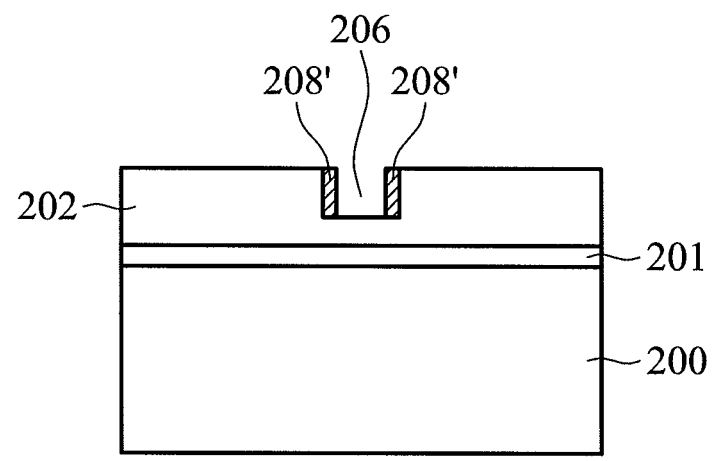
Figure 3:
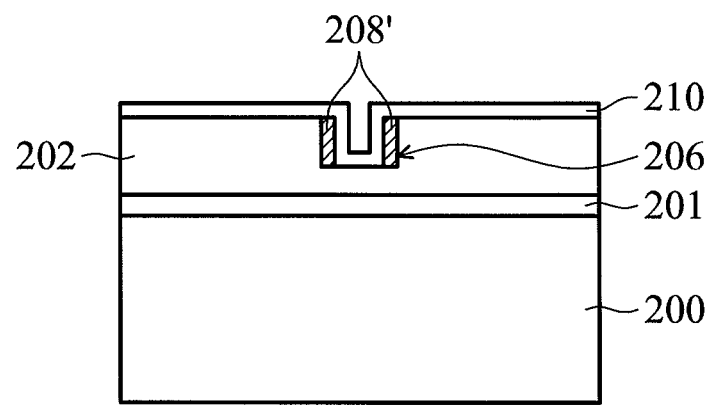
Figure 3:
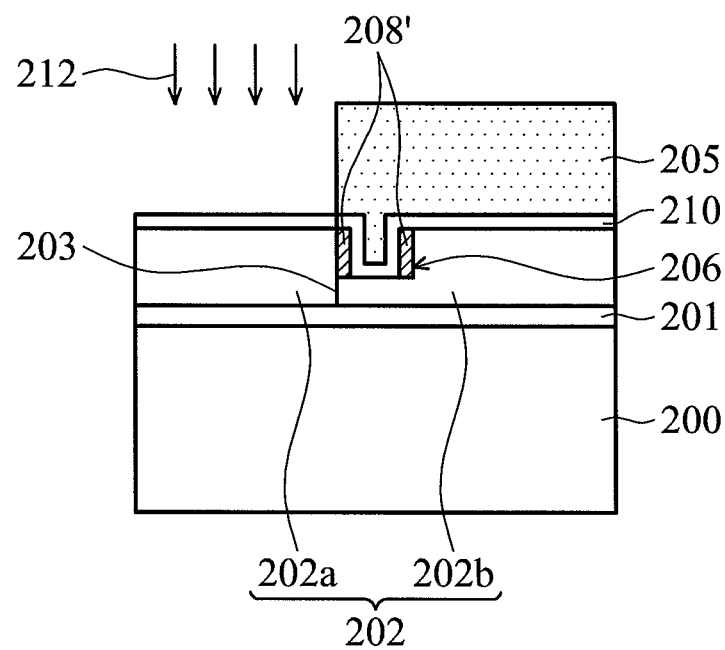

Refer to FIG. 3C, an insulating layer 208 is formed on the first semiconductor layer 202 and fills the trench 206. In the embodiment, the thickness of the insulating layer 208 is 3 nm, but it is not limited thereto. In another embodiment, the insulating layer 208 may have different thickness. Next, as shown in FIG. 3D, an insulating spacer 208' is formed on the sidewall of the trench 206. In the embodiment, the insulating layer 208 on the first semiconductor layer 202 and at bottom of the trench 206 is removed by reactive ion etching (RIE) process or another suitable anisotropic etching process, to form the insulating spacer 208'. In the embodiment, the material of the insulating layer 208 may comprise silicon oxide, silicon nitride, silicon oxynitride or any suitable insulating material. In the embodiment, the insulating layer 208 may be formed by CVD, PVD, atomic layer deposition (ALD), thermal oxidation or any suitable method.

Refer to FIG. 3E, a second semiconductor layer 210 is formed on the first semiconductor layer 202 and fills the trench 206 to cover the insulating spacer 208'. In the embodiment, the thickness of the second semiconductor layer 210 is 50 nm, but it is not limited thereto. In another embodiment, the second semiconductor layer 210 may have different thickness. In the embodiment, the total thickness of the first semiconductor layer 202 and the second semiconductor layer 210 is the same as the thickness of the semiconductor layer 102, thereby preventing the change of device characteristics. For example, if the thickness of the semiconductor layer 102 is 200 nm, then the thickness of the first semiconductor layer 102 may be 150 nm and that of the second semiconductor layer 210 may be 50 nm, such that the total thickness of the first and second semiconductor layers is also 200 nm, but it is not limited thereto. In other embodiments, the thickness may vary. The material and the fabrication of the second semiconductor layer 210 is the same as or similar to that of the first semiconductor layer 202 and the semiconductor layer 102, thus not described herein.

Refer to FIG. 3F, a first doping process (e.g., an ion implantation process) is selectively performed to the first semiconductor layer 202 and the second semiconductor layer 210 to form a junction 203, and a first region 202a and a second region 202b defined by the trench 206 and the insulating spacer 208'. In the embodiment, a patterned photoresist layer 205 is formed on the first semiconductor layer 202 and the second semiconductor layer 210 to act as an implant mask, thereby defining the region on which the first doping process 212 to be performed. In the embodiment, the first doping process 212 may be performed using dopants of first conductivity type, such as N-type dopants (e.g., P or As) or P-type dopants (e.g., B).

Figure 3G:
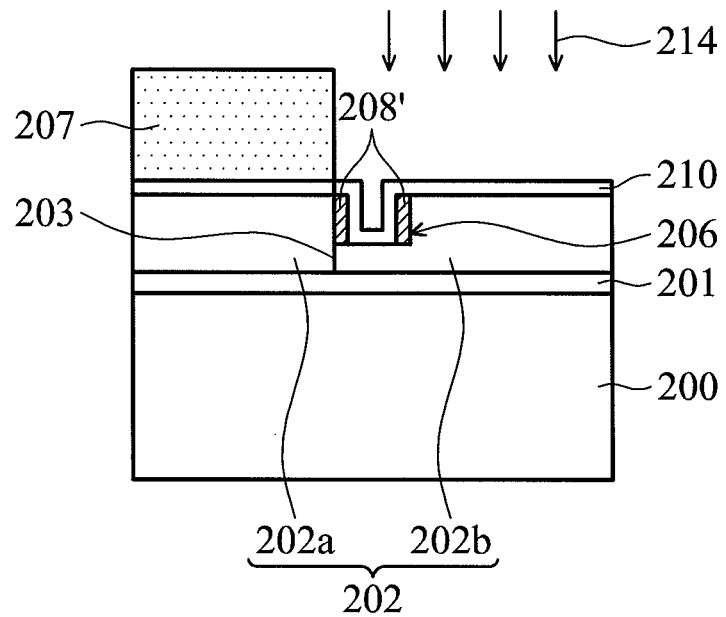

Refer to FIG. 3G, in an embodiment, a second doping process 214 (e.g., an ion implantation process) is performed on the second region 202b, such that the second region 202b is doped with dopants of the second conductivity type opposite to the first conductivity type. For example, the first region 202a may be doped with N-type dopants, and the second region 202b may be doped with P-type dopants, and vise versa. In the embodiment, a patterned photoresist layer 207 is formed on the first region 202a to act as an implant mask, such that the exposed second region 202b is doped with dopants of the second conductivity type.

In another embodiment, there is no doping process performed on the second region 202b. Namely, the second region 202b is an undoped region.

Figure 3H:
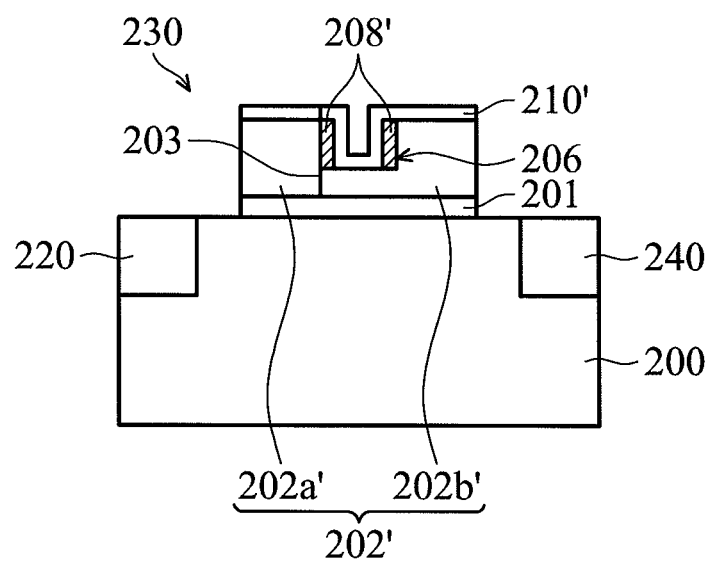

Refer to FIG. 3H, the first semiconductor layer 202 and the second semiconductor layer 210 are patterned to form the gate of the transistor 230 on the substrate 200. The gate is composed of a first gate electrode portion 202' and a second gate electrode portion 210'. In the embodiment, the step of patterning the first semiconductor layer 202 and the second semiconductor layer 210 include applying a patterned photoresist layer (not shown) on the first semiconductor layer 202 and the second semiconductor layer 210. The regions of the first semiconductor layer 202 and the second semiconductor layer 210 not protected by the photoresist layer are then removed by a standard etching process to form the first gate electrode portion 202' and the second gate electrode portion 210', respectively. In the embodiment, the fabrication of the transistor 230 further comprises forming other components of the transistor 230 (e.g., source/drain regions) (not shown) in the substrate 200. Such a fabrication is known for those skilled in the art and thus not describe herein.

Still refer to FIG. 3H, in the embodiment, a photodiode 220 and a floating diffusion region 240 are formed in the substrate 200 on opposite sides of the first and second gate electrode portions 202' and 210', respectively. The fabrications of the photodiode 220 and the floating diffusion region 240 are known for those skilled in the art and thus not describe herein. Furthermore, it is appreciated that the positions of the photodiode 220 and the floating diffusion region 240 may be modified if needed, thus they are not limited to the positions illustrated in FIG. 3H. In the embodiment, the transistor 230 is a transfer gate transistor of CIS device, which transfers the charges generated from the photodiode 220 to the floating diffusion region 240, but it is not limited thereto. The structures and the fabrications of the first gate electrode portion 202' and the second gate electrode portion 210' can be applied to other transistors in the image sensor device, such as the overflow gate transistor.

In the above embodiments of the image sensors, the trench and the insulating spacer formed at the interface between different doping regions in the gate electrode portion of the transfer gate transistor prevent the diffusion of the dopants in the doping regions, thereby preventing the interface from shifting away from its original position due to subsequent processes (e.g., annealing processes). In the fabrication of the conventional image sensor with a transfer gate transistor having an interface between different doping regions therein, the process parameters for the transfer gate transistor cannot be optimized because the position of the interface between different doping regions in the gate electrode portion cannot be accurately controlled. As a result, the performance of the image sensor cannot be optimized. The embodiments of the image sensor mitigate the above problems.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device, comprising:
a transistor, comprising:
a substrate;
a gate oxide layer on the substrate; and
a first gate electrode portion on the gate oxide layer, wherein the first gate electrode portion has a trench to define a position of a junction extending from a bottom of the trench to the substrate, and wherein the trench defines a first region and a second region within the first gate electrode portion, the first region has a first conductivity type, and the second region has a second conductivity type or is an undoped region.

2. The image sensor device as claimed in claim 1, wherein the substrate comprises a P-type or N-type epitaxial region.

3. The image sensor device as claimed in claim 1, further comprising a photodiode and a floating diffusion region formed in the substrate on opposite sides of the first gate electrode portion, respectively.

4. The image sensor device as claimed in claim 1, wherein the transistor is a transfer gate transistor.

5. The image sensor device as claimed in claim 1, wherein the first conductivity type is N-type, and the second conductivity type is P-type.

6. The image sensor device as claimed in claim 1, wherein the first conductivity type is P-type, and the second conductivity type is N-type.

7. The image sensor device as claimed in claim 1, wherein the trench is on both sides of the junction and corresponds to the first region and the second region.

8. The image sensor device as claimed in claim 1, wherein the trench is on either side of the junction and corresponds to the first region or the second region.

9. The image sensor device as claimed in claim 8, wherein the transistor further comprises:
   an insulating spacer on a sidewall of the trench; and
   a second gate electrode portion on the first gate electrode portion and filling the trench to cover the insulating spacer.

10. The image sensor device as claimed in claim 9, wherein the first and second gate electrode portions comprise a polysilicon or a single-crystalline silicon.

11. A method for manufacturing an image sensor device, comprising:
   providing a substrate; and
   forming a transistor in the substrate, wherein the transistor has a first gate electrode portion on a gate oxide layer on the substrate, wherein the first gate electrode portion has a trench to define a position of a junction extending from a bottom of the trench to the substrate, and wherein the trench defines a first region and a second region within the first gate electrode portion, the first region has a first conductivity type, and the second region has a second conductivity type or is an undoped region.

12. The method as claimed in claim 11, wherein the substrate comprises a P-type or N-type epitaxial region.

13. The method as claimed in claim 11, further comprising forming a photodiode and a floating diffusion region in the substrate on opposite sides of the first gate electrode portion, respectively.

14. The method as claimed in claim 11, wherein the transistor is a transfer gate transistor.

15. The method as claimed in claim 11, wherein the first conductivity type is N-type, and the second conductivity type is P-type.

16. The method as claimed in claim 11, wherein the first conductivity type is P-type, and the second conductivity type is N-type.

17. The method as claimed in claim 11, wherein the step of forming the transistor comprises:
   forming a semiconductor layer on the substrate;
   performing a first doping process on a region of the semiconductor layer to form the first region, the second region and the junction therebetween;
   forming the trench on both sides of the junction, such that the trench corresponds to the first region and the second region; and
   patterning the semiconductor layer to form the first gate electrode portion.

18. The method as claimed in claim 17, further comprising performing a second doping process on the second region after the first doping process is performed.

19. The method as claimed in claim 11, wherein the step of forming the transistor comprises:
   forming a first semiconductor layer on the substrate;
   forming the trench in the first semiconductor layer;
   forming an insulating spacer on a sidewall of the trench;
   forming a second semiconductor layer on the first semiconductor layer and filling the trench to cover the insulating spacer;
   selectively performing a first doping process on the first and second semiconductor layers to form the first region, the second region and the junction therebetween; and
   patterning the first and the second semiconductor layer to form the first gate electrode portion and a second gate electrode portion, respectively.

20. The method as claimed in claim 19, further comprising performing a second doping process on the second region after the first doping process is performed.

* * * * *